(12) United States Patent
Oberle

(10) Patent No.: US 7,268,740 B2
(45) Date of Patent: *Sep. 11, 2007

(54) METHOD FOR FORMING RADIO FREQUENCY ANTENNA

(75) Inventor: Robert R. Oberle, Macungie, PA (US)

(73) Assignee: RCD Technology Inc., Quakertown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/925,229

(22) Filed: Aug. 24, 2004

(65) Prior Publication Data

US 2005/0078035 A1    Apr. 14, 2005

Related U.S. Application Data

(63) Continuation-in-part of application No. 10/238,598, filed on Sep. 11, 2002, now Pat. No. 6,933,892, which is a continuation of application No. 09/524,505, filed on Mar. 13, 2000, now Pat. No. 6,476,775.

(51) Int. Cl.
*H01Q 7/00* (2006.01)

(52) U.S. Cl. ..................... 343/866; 343/867

(58) Field of Classification Search ............ None
See application file for complete search history.

(56) References Cited

U.S. PATENT DOCUMENTS

| | | | |
|---|---|---|---|
| 3,759,246 A | 9/1973 | Flack et al. ............. 600/573 |
| 5,058,161 A | 10/1991 | Weiss ..................... 380/23 |
| 5,463,377 A | 10/1995 | Kronberg ............... 340/605 |
| 5,598,032 A * | 1/1997 | Fidalgo .................. 257/679 |
| 5,629,981 A | 5/1997 | Nerlikar ................. 380/25 |
| 5,874,902 A | 2/1999 | Heinrich et al. ........ 340/825.54 |
| 5,892,611 A | 4/1999 | Iisuka .................... 359/204 |
| 5,942,978 A | 8/1999 | Shafer .................... 340/572.9 |
| 5,963,134 A | 10/1999 | Bowers et al. ......... 340/572.1 |
| 6,049,461 A * | 4/2000 | Haghiri-Tehrani et al. .. 361/737 |
| 6,089,284 A | 7/2000 | Kaehler et al. ........ 141/94 |
| 6,111,520 A | 8/2000 | Allen et al. ............ 340/870.16 |
| 6,130,623 A | 10/2000 | MacLellan et al. .... 340/825.54 |
| 6,133,833 A | 10/2000 | Sidlauskas et al. .... 340/572.1 |
| 6,204,760 B1 | 3/2001 | Brunius ................. 340/529 |
| 6,268,796 B1 * | 7/2001 | Gnadinger et al. .... 340/572.5 |

(Continued)

FOREIGN PATENT DOCUMENTS

EP    0903805 A2    3/1999

*Primary Examiner*—Trinh Vo Dinh
(74) *Attorney, Agent, or Firm*—Fliesler Meyer LLP

(57) ABSTRACT

A metalized circuit suitable for application as a radio frequency antenna is produced by forming an antenna coil pattern on a flexible substrate. The antenna coil pattern is formed using a conductive ink which is patterned on the substrate. The conductive ink is cured and an electrical-short layer is formed across the coils of the conductive ink pattern. An insulating layer is formed over top of the electrical-short layer, a metal layer electroplated on top of the conductive layer, and then the electrical-short layer is removed. The use of the electrical-short layer during the electroplating allows for the voltage at the different points on the conductive ink layer to be relatively similar, so that a uniform electroplate layer is formed on top of the conductive ink layer. This results in a better quality radio frequency antenna at a reduced cost.

23 Claims, 6 Drawing Sheets

U.S. PATENT DOCUMENTS

| | | | |
|---|---|---|---|
| 6,400,323 B2 * | 6/2002 | Yasukawa et al. | 343/700 MS |
| 6,421,013 B1 | 7/2002 | Chung | 343/700 MS |
| 6,476,775 B1 * | 11/2002 | Oberle | 343/895 |
| 6,514,790 B1 | 2/2003 | Plettner et al. | 438/106 |
| 6,774,800 B2 | 8/2004 | Friedman et al. | 340/573.5 |
| 6,849,936 B1 * | 2/2005 | Berman et al. | 257/679 |
| 2002/0140608 A1 | 10/2002 | Zaghloul et al. | |
| 2003/0116790 A1 * | 6/2003 | Kikuchi et al. | 257/208 |
| 2004/0070510 A1 | 4/2004 | Zhang et al. | |
| 2004/0203235 A1 * | 10/2004 | Miyakawa | 438/689 |

* cited by examiner

METHOD FOR FORMING RADIO FREQUENCY ANTENNA

CLAIM OF PRIORITY

This application is a continuation in part of U.S. patent application Ser. No. 10/238,598 filed Sep. 11, 2002, now U.S. Pat. No. 6,933,892, which is a continuation of U.S. patent application Ser. No. 09/524,505 filed Mar. 13, 2000, now U.S. Pat. No. 6,476,775.

BACKGROUND OF THE INVENTION

The present invention relates to methods of manufacture of flexible circuits used in construction of radio frequency (RF) antennae.

Radio frequency antennae are typically made in a conductive coil pattern. The conductive coil pattern allows the antenna to receive and radiate energies in the radio frequency range. Typically, the antenna is optimized to transmit and receive energy in a relatively narrow portion of the radio frequency range.

Radio frequency antennae are used in a number of different areas including inventory control. Often the radio frequency antenna is connected to an integrated circuit. The integrated circuit receives energy from a detector unit, modulates the energy with an identification pattern stored in the integrated circuit, and then retransmits the modulated energy to the detector unit. Such inventory control units, including the radio frequency antennae, can be made quite inexpensively.

One way of forming a radio frequency antenna is to stamp out a conductive coil out of a sheet of metal. The downside of this method is that the production of the metal coil results in a large amount of scrap metal. Additionally, the radio frequency antennae produced by stamping from a sheet of metal may be stiffer than desired.

Another way of forming the radio frequency antenna is to use strip-back techniques common in printed circuit (PC) board fabrication. In PC board fabrication, a layer of the conductive material is formed on top of a substrate, and the areas not used for the antenna are stripped away. This method tends to be wasteful when used to produce the radio frequency antenna, because the radio frequency coil antenna tends to be about 10% of the surface area of the substrate. This compares to coverage areas of 70-80% common with typical PC board implementations.

Another way of forming a radio frequency antenna is to use conductive inks. Typically, the conductive ink is printed in a RF antenna coil pattern on top of the substrate. The conductive ink is then cured. The printed antennae may be used as is or electrodes are attached to the conductive ink pattern and a metal layer is electroplated on top of the conductive ink pattern. FIG. 1 illustrates this prior art embodiment. The electrode is attached pad 22 to electroplate the metal material on top of the conductive ink pattern. Because of its cost, the conductive ink material tends to be applied in relatively narrow and thin layers. This means that when a voltage source is attached to pad 22, there is considerable electrical resistance between pad 22 and point 24 near the center of the pattern. Due to this electrical resistance, the electroplated material preferentially coats the areas near the electrode at pad 22, rather than position 24. This makes it difficult to obtain a proper electroplated coating on top of the conductive ink.

One possible solution is to use the conductive ink with a thicker or wider pattern, thus reducing the resistance per length of the conductive ink strip. The downside of this solution is that the conductive ink is expensive compared to the much cheaper electroplated material.

For the above reasons, it is desired to have an improved method of forming a radio frequency antenna.

SUMMARY OF THE PRESENT INVENTION

The present invention is a method and apparatus of forming a flexible circuit for use as a radio frequency antenna which uses a temporary electrical-short layer. In one embodiment of the present invention, a seed layer, such as a conductive ink layer, is formed in the coil antenna pattern on a substrate. An electrical-short layer pattern of a conductive material is placed over the coils, such that the coil is electrically shunted together. An insulating layer is formed over top of the electrical-short layer. Next, electroplating occurs, so that the electroplated material forms over top of the conductive ink material. The electrical-short layer and the insulating layer are then removed.

The use of the electrical-short layer has the advantage that it allows the resistance between the electrode and the other locations on the conductive ink layer to be reduced. The electrical-short layer effectively results in a more uniform electroplating on all the points on the radio frequency coil pattern. This avoids the problem that occurred in the prior art of requiring a relatively thick conductive ink layer. In the method of the present invention, an effectively uniform conductive electroplate layer can be produced.

Another embodiment of the present invention is a radio frequency antenna, which is formed by the method of the present invention. This radio frequency antenna includes a substrate, a conductive ink layer in the form of an antenna coil, and a conductive electroplate layer on top of the conductive ink layer, with the conductive electroplate layer having a removed short region. The removed short region comprises a portion of the seed layer not covered by the conductive material, or comprises a portion of the seed layer wherein the conductive layer is thinner than the remaining portions. Another embodiment of the present invention comprises a method for forming a radio frequency antenna. The method comprises: providing a substrate layer; forming one or more holes in the substrate layer; attaching a conductive foil layer on one or both sides of the substrate layer, such that the conductive foil covers the holes; and forming conductive layer(s) on one (both) sides of the substrate in an antenna coil pattern, with the conductive ink to form an electric contact with the metal foil. The conductive ink has the advantage that it can easily go into the holes to form that connection to a conductive foil and the circuit elements on the substrate. Prior ways of forming a connection between two sides of the substrate for the radio frequency antenna include punching holes through a conductive metal layer to a conductive metal layer on the other side of the substrate. The punch would hopefully force some metal on the one layer to contact the metal on the other layer. This has the downside of it being unreliable and prone to failure during the operation of the radio frequency antenna.

DETAILED DESCRIPTION OF THE PREFERRED EMBODIMENTS

Figure 1:
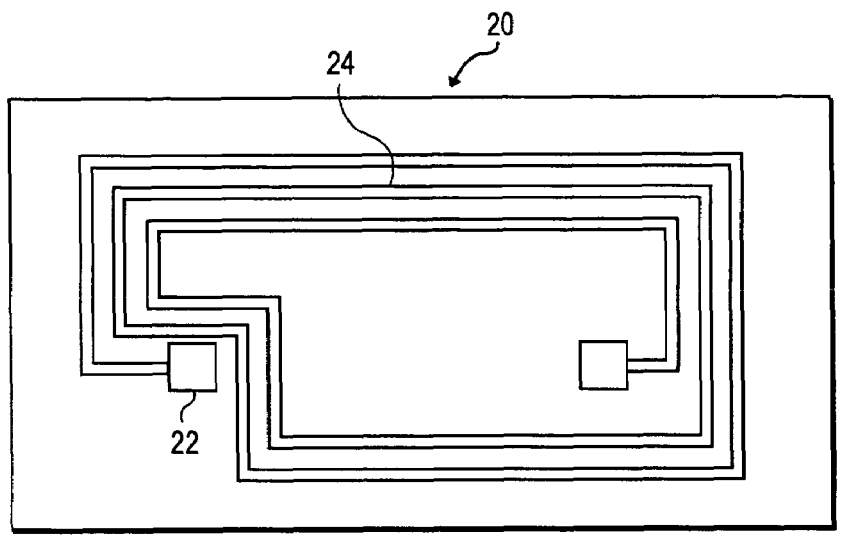
FIG. 1 is a diagram, of a prior art radio frequency antenna.
Figure 2:
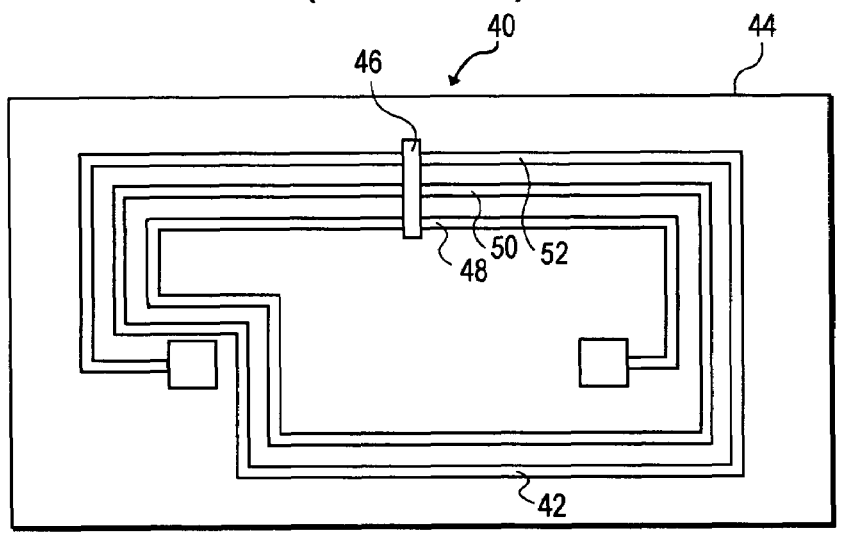
FIG. 2 is a diagram illustrating the construction of the radio frequency antenna of the present invention using an electrical-short layer.

FIG. 2 is a top view of a radio frequency antenna 40 being constructed by the method of one embodiment of the present invention. The radio frequency antenna 40 includes a conductive ink pattern 42 formed in a coil on the substrate 44. An electrical-short layer 46 is formed over top of the conductive ink coil pattern, and preferably a nonconductive plating resist is formed over the short. The electrical-short layer 46 ensures that points 48, 50 and 52 on the conductive ink pattern 42 will have relatively similar voltages during the electroplating process. This means all locations on the conductive ink pattern 42 will be electroplated evenly. Thus the apparatus of the present invention allows for a conductive electroplate layer of sufficient thickness on all points of the radio frequency antenna.

The use of the electrical-short layer 46 allows for the use of a thinner and/or narrower conductive ink layer 42. The resistance of the conductive ink layer during the electroplate process is not as important of a factor because the electrical-short layer is used.

Typically it is desired to minimize the resistance of the radio frequency antenna. A desirable property of radio frequency antennae is to have a relatively high Q factor. The Q factor for an antenna is defined as the imaginary over the real part of the impedance. The imaginary part of the impedance is typically a function of the desired operating frequency and geometry and is typically fixed. Thus, to produce a high Q factor antenna, the resistance of the antenna should be kept as small as possible. This means that it is desired to have a relatively thick conductive metal layer forming the coils of the radio frequency antenna. The use of the electrical-short layer of the present invention aids in the construction of a uniformly thick electroplate layer, thus lowering the resistance and raising the Q factor.

Figure 3:
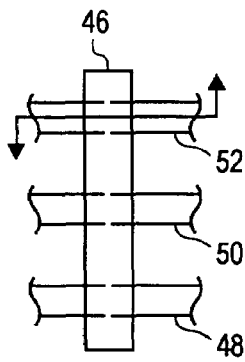
FIG. 3 is a detail of a top view of the electrical-short layer placed on top of the loops of the conductive ink coil pattern of one embodiment of the present invention.

FIG. 3 is a detail of a portion of FIG. 2.

Figure 4A:
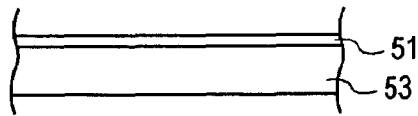
FIGS. 4A-4E are cross-sectional diagrams illustrating the construction of the radio frequency antenna according to one embodiment of the present invention.
Figure 4B:
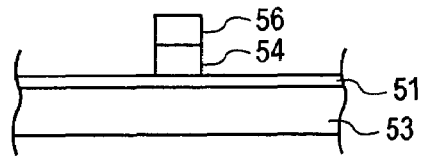
Figure 4C:
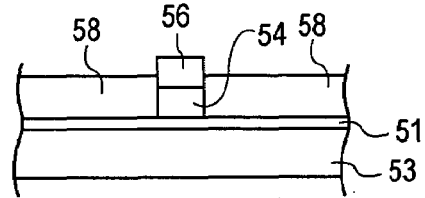
Figure 4D:
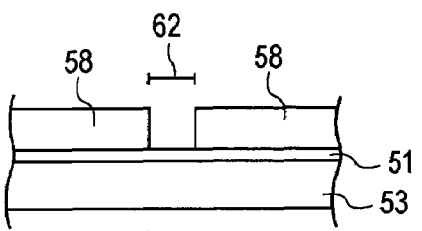

FIGS. 4A-4E are cross-sectional views illustrating the construction of one embodiment of the radio frequency antenna of the present invention. In FIG. 4A, a conductive seed layer 50 is formed on top of the substrate 52. In the preferred embodiment, the substrate 52 is a flexible substrate which allows the constructed radio frequency antenna to bend. One example of a flexible substrate material which is suitable for use with the present invention is Mylar.RTM., polyester film from E.I. DuPont de Nemours, Wilmington, Del. A conductive seed layer 50 is formed in a coil pattern shown with respect to FIG. 2 above. In one embodiment of the present invention, the conductive seed layer 50 is a conductive ink layer. The conductive ink layer could be of the type such as EnTouch.TM. EN-079 from Engelhard Corporation Iselin, N.J. In FIG. 4B, the electrical-short layer material 54 is formed over top of the coil pattern 50. The electrical short ink layer could be of the type such as EnTouch.TM. EN-081 from Engelhard Corporation Iselin, N.J. An additional insulating layer 56 is preferably formed on top of the electrical-short layer 54. The insulating ink layer could be of the type such as EnTouch.TM. EN-080 from Engelhard Corporation Iselin, N.J. The conductive ink layer 50 can be printed upon the flexible substrate, as is known in the prior art. In one embodiment, the electrical-short layer 54, and the insulating layer, 56 are differentially removable (for example soluble in a solvent that the initial seed layer is impervious to) from the conductive ink material. FIG. 4C illustrates the results of the electroplating, in which a conductive material 58 is formed over top of the conductive ink layer 50. The insulating layer 50 preferably prevents an electroplate layer from forming on the electrical-short layer. The conductive layer 58 is preferably an inexpensive metal material. In one embodiment of the present invention, the conductive layer 58 is made of copper. In FIG. 4D, the electrical-short layer 54 and the insulating layer 56 are stripped away. The stripping can be done using a solvent, ashing, reactive gas or any other method.

Figure 4E:
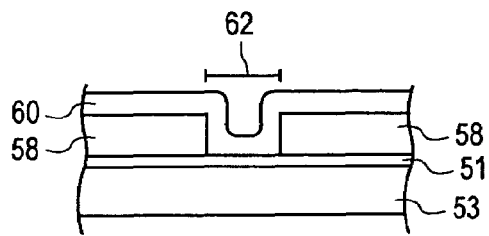

In an alternate embodiment of the present invention, the electrical-short layer 54 is constructed of metallic foil, which could be attached to the RF antenna and then removed after the electroplating. FIG. 4E shows an optional additional step of a second electroplating in which an additional electroplate layer 60 is formed on top of the first electroplate layer 58. The advantage of the second electroplate step is that it allows for some electroplate material to go into the removed short layer region 62.

Figure 5:
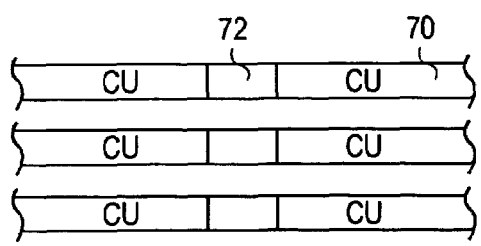
FIG. 5 illustrates a detail of one embodiment of a radio frequency antenna constructed by the method of one embodiment of the present invention.

FIG. 5 illustrates a detail of the formed radio frequency antenna produced with the method of one embodiment of the present invention. Note that most of the radio frequency antenna includes electroplated copper portions 70, but the small removed electrode portion 72 consists of the conductive ink layer by itself. As long as the removed short region 72 remains relatively thin, the total increased resistance caused by the removed short region 72 will not be too high. In fact, the total resistance of the radio frequency antenna is reduced as a result of the more effective electroplating of the present invention.

Figure 6:
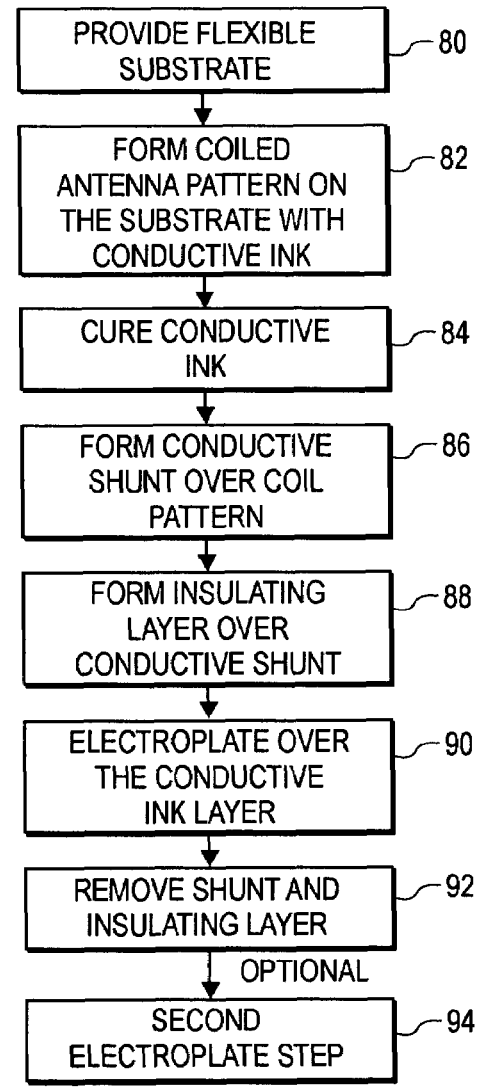
FIG. 6 is a flow chart illustrating one method of the present invention.

FIG. 6 is a flow chart illustrating one embodiment of the present invention. In Step 80, a flexible substrate is provided. In Step 82, a coil antenna pattern is formed on the substrate with the conductive ink. In Step 84, the conductive ink is cured. In Step 86, an electrical-short layer is formed over a portion of the coil pattern. In a preferred embodiment, the electrical-short layer is formed of differentially removable conductive ink. In Step 88, an insulating layer is formed over the electrical-short layer. In Step 90, the electroplating is done to form a conductive electroplate layer on the conductive ink layer. In Step 92, the electrical-short layer and insulating layer are removed. This is preferably using a solvent that removes the electrical-short layer and insulating layer, yet does not affect the cured conductive ink layer. Step 94 is an optional second electroplating step.

Figure 7A:
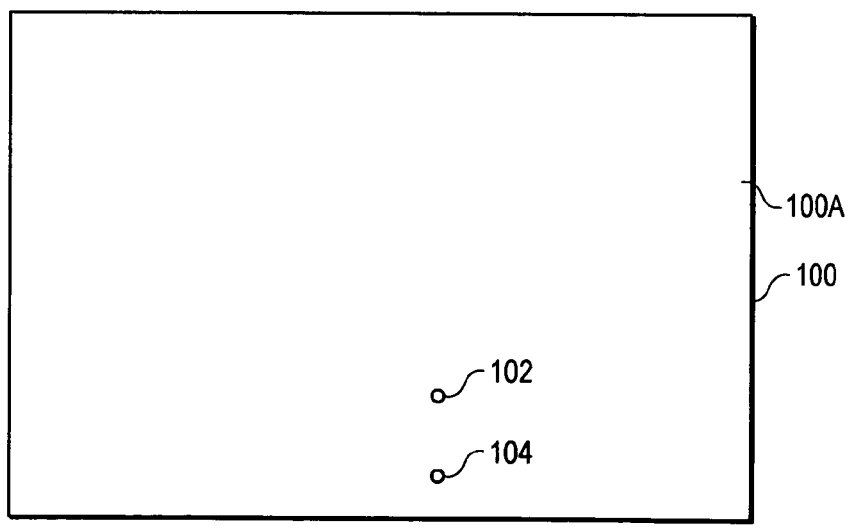
FIGS. 7A-7C are diagrams illustrating the construction of a radio frequency antenna according to another embodiment of the present invention.
Figure 7B:
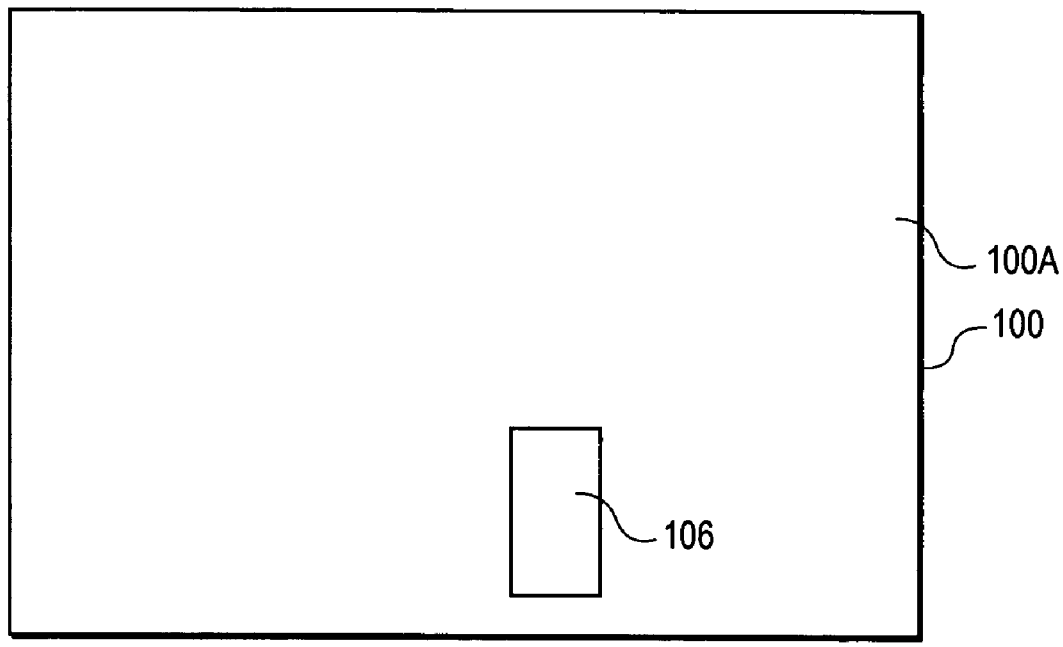
Figure 7C:
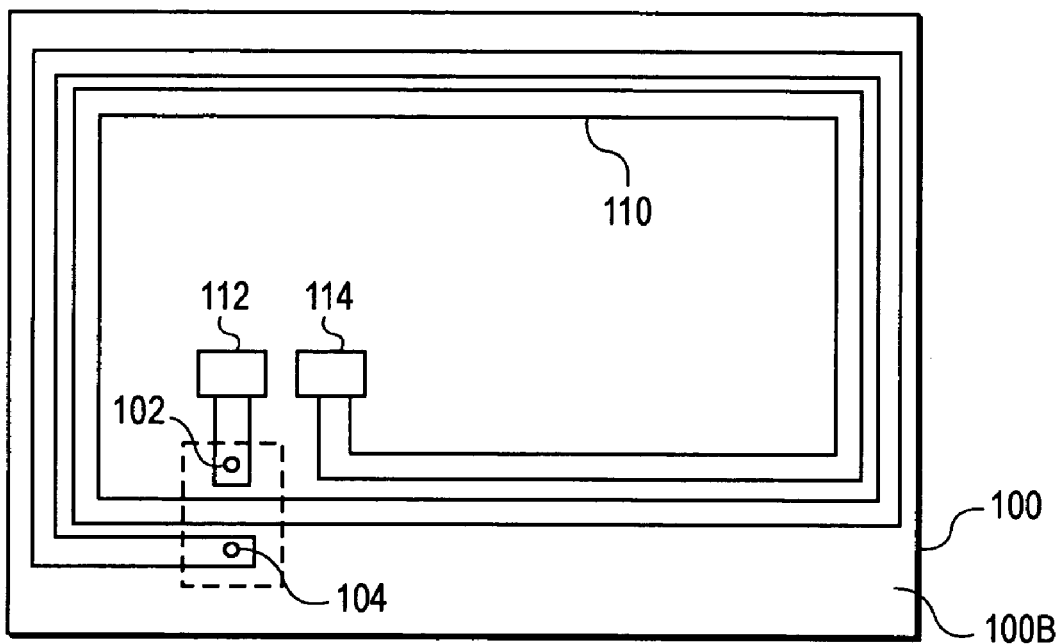

FIGS. 7A-7C illustrate another embodiment of the present invention. In FIG. 7A, a flexible substrate 100 is provided. Holes 102 and 104 are punched into the flexible substrate material 100. Looking at FIG. 7B, a conductive foil 106 is attached over holes 102 and 104. FIGS. 7A and 7B are shown with side 100a of the flexible substrate 100 shown on top. In FIG. 7C, the flexible substrate 100 is flipped to the other side 100b. In this side, the conductive ink layer 110 forms a coil pattern. The shunt 106 on side 00a of the flexible substrate 100 allows that the pads 112 and 114 can be adjacent to one another for easy connection to the integrated circuit (IC) (Not shown). By using the metal foil shunt 106, the loops of the coil pattern on the radio frequency antenna need not be positioned between pads 112 and 114. Next, an electroplating step can be done to form an electroplated conductive layer on top of the conductive ink coil pattern.

The conductive ink material easily flows inside relatively small holes used to connect between the conductive shunt 106 and the top side of the flexible substrate 100.

Figure 8A:
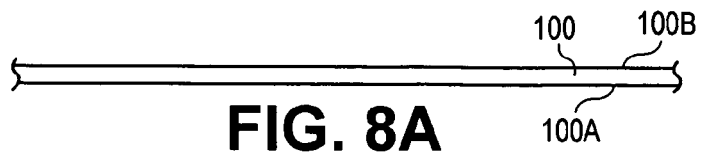
FIGS. 8A-8D are cross-sectional diagrams illustrating the construction of one embodiment of the radio frequency antenna according to FIGS. 7A-7C.
Figure 8B:
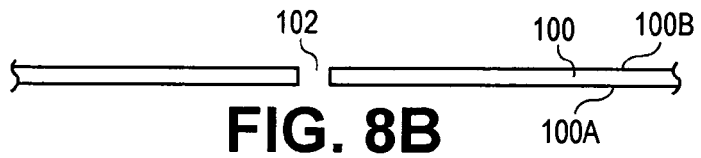
Figure 8C:
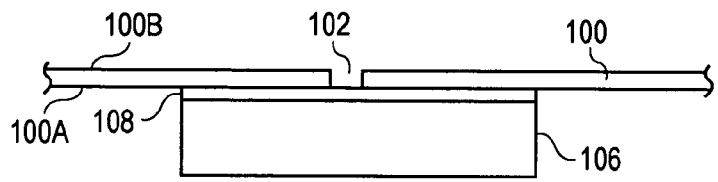
Figure 8D:
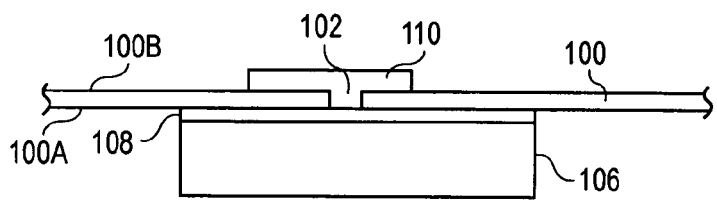

FIGS. 8A-8D are cross-sectional views illustrating the construction of the system FIGS. 7A-7C. FIG. 8A illustrates the flexible substrate 100. In FIG. 8B, a hole 102 is formed in the flexible substrate 100. In FIG. 8C, the conductive foil material 106 is connected to the substrate 100. In one embodiment, a conductive adhesive 108 can be used to hold the metal foil material 106 to the substrate 100. FIG. 8B is shown with the conductive ink material 110 which enters the hole 102 to form an electrical contact with the shunt 106. The electrically conductive ink material easily flows into the hole 102. Note that the use of a shunt may make non-plated ink antennae feasible. In one embodiment, the use of the shunt allows the resistance of the antenna to be reduced which can make it feasible to use a non-plated conductive ink layer. The shunt also allows for the conductive antenna coil pattern to be formed on both sides of the substrate layer, allowing for a thicker printed pattern. In one embodiment, only a single hole is used. One example of this embodiment is a system with an internal capacitor in the substrate layer forming a return path.

Figure 9A:
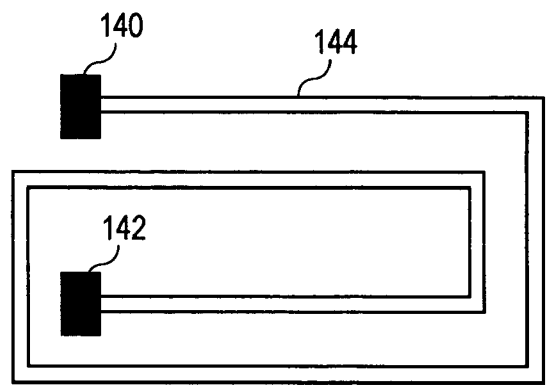
FIGS. 9A-9E are diagrams illustrating the construction of a radio frequency antenna according to one embodiment in which portions of the bond pads are not covered by a conductive layer.
Figure 9B:
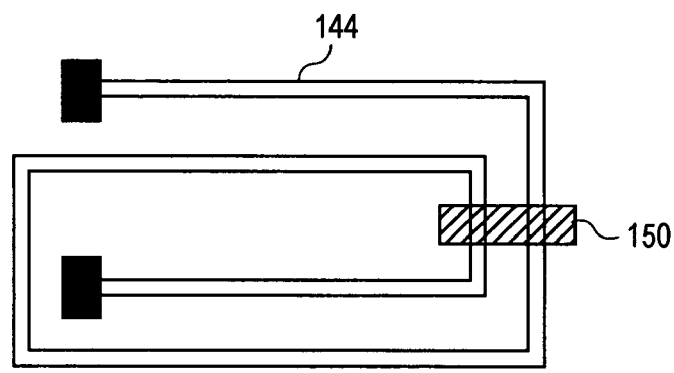
Figure 9C:
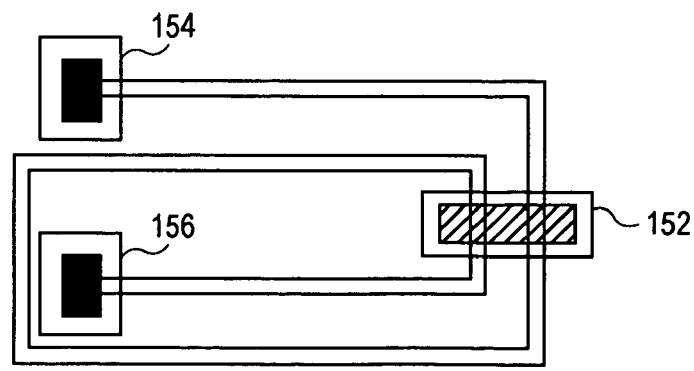
Figure 9D:
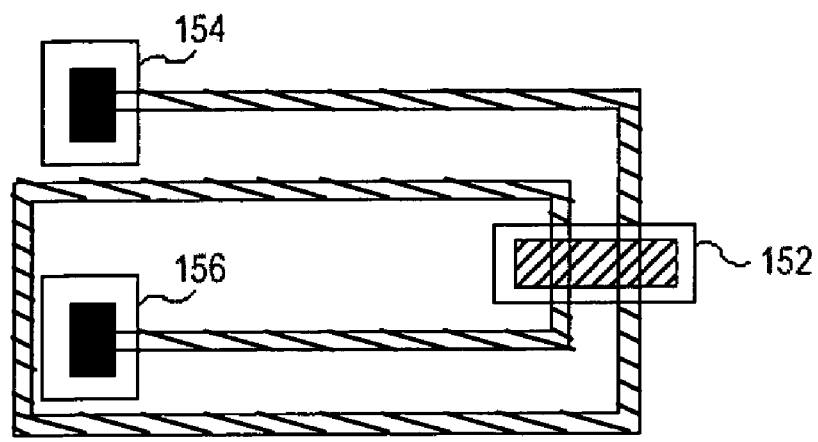
Figure 9E:
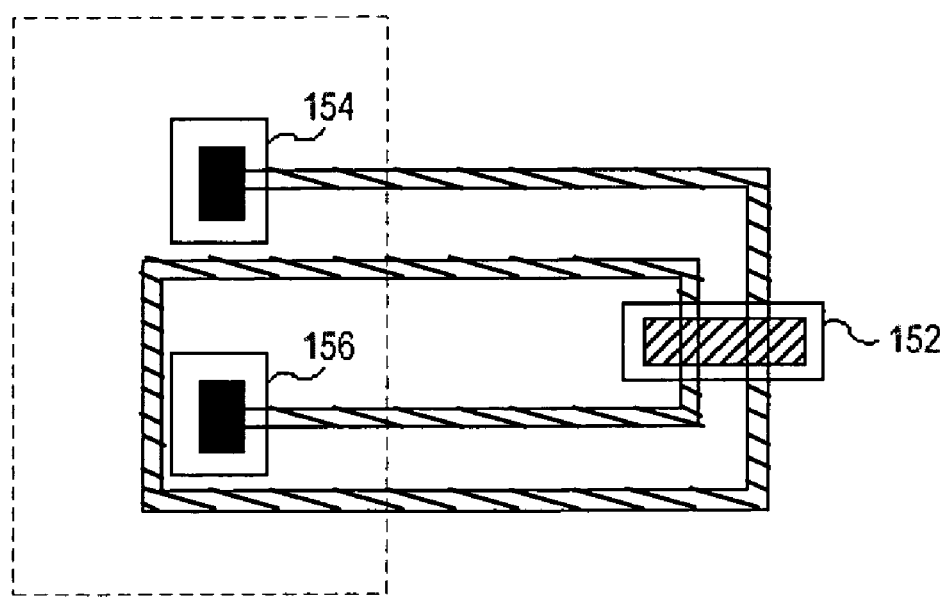

FIGS. 9A-9C illustrate an example, which a portion of the bond pads are not covered by the conductive layer. In one embodiment, the uncovered bonds pads allow for a better connection to an integrated circuit.

FIG. 9A illustrates the construction of a seed layer antenna pattern including the bond pads 140 and 142 and the antenna pattern 144. As shown in FIG. 9B in one embodiment a removable shunt 150 is placed over the pattern 144. As shown in FIG. 9C, a removable insulating layer 152, 154 and 156 can be placed over at least a portion of the bond pads and shunt. The uncovered portion of the antenna pattern can then be plated with a conductive layer in a manner described above.

One embodiment of the present invention is an RF antenna comprising of a substrate layer and a seed layer on top of the substrate in an antenna coil pattern. The seed layer includes bond pads. A conductive layer is portioned over portions of the antenna coil pattern. The conductive layer in one embodiment does not cover at least a portion of the bond pad.

In one embodiment, the conductive layer does not cover any portion of the bond pad. The antenna can have a removed short region across the antenna coil pattern. The removed short region can comprise a portion of the seed layer not covered by the conductive material or comprise a portions of the seed layer where the conductive layer is thinner than the remaining portion of the conductive layer. A integrated circuit can be connected between the bond pads to form a RFID system. The seed layer can comprise cured conductive ink layer.

The above description is meant to be exemplary only. Additional ways of implementing the invention are done within the scope of the present invention, which is to be limited only by the appended claims.

I claim:
1. An RF antenna comprising:
a substrate layer;
a seed layer on top of the substrate in an antenna coil pattern, the seed layer including bond pads;
a conductive layer over portions of the antenna coil pattern, wherein the antenna has a removed short region across the coil pattern, the removed short region comprising a portion of the seed layer not covered by the conductive layer or comprising a portion of the seed layer wherein the conductive layer is thinner than the remaining portions of the conductive layer, wherein the conductive layer does not cover at least a portion of the bond pads.

2. The RF antenna of claim 1 wherein the removed short region includes adjacent sections of the antenna coil pattern.

3. The RF antenna frequency antenna of claim 1 wherein the seed layer comprises a cured conductive ink layer.

4. The RF frequency antenna of claim 1 wherein the removed short region comprises a portion of the seed layer not covered by conductive layer.

5. The RF frequency antenna of claim 1 wherein the removed short region comprises a portion of the seed layer wherein the conductive layer is thinner than the remaining portions of the conductive layer.

6. The RF frequency antenna of claim 5 wherein the removed short region includes a single electroplated layer while the remaining portions of the conductive layer comprises two electroplated layers.

7. A method of forming an RF antenna, comprising:
providing a substrate layer;
forming a seed layer on top of the substrate in an antenna coil pattern, the seed layer including bond pads;
forming an electrical-short layer across the coil pattern;
using the electrical-short layer to electroplate a conductive layer over at least a part of the antenna coil pattern, wherein the conductive layer does not cover at least a portion of bond pads and;
removing the electrical-short layer.

8. The method of claim 7 wherein the seed layer comprises a conductive ink layer.

9. The method of claim 8 wherein the conductive ink layer is cured.

10. The method of claim 7 wherein a non-conductive layer is formed over top of the electrical-short layer before the electroplating step.

11. The method of claim 7 wherein the removing step comprises using a solvent to remove the electrical-short layer.

12. The method of claim 7 wherein the electrical-short layer is differentially removable from the seed layer.

13. The method of claim 7 wherein the substrate layer is flexible.

14. The method of claim 7 wherein the electrical-short layer comprises a line across one section of the coil pattern.

15. An RF antenna comprising:
a substrate layer;
a seed layer on top of the substrate layer in an antenna coil pattern, the seed layer including bond pads;
a conductive layer contacting the seed layer over portions of the antenna coil pattern, wherein the conductive layer does not cover at least a portion of the bond pads;
wherein the antenna has a removed short region across the coil pattern and;

wherein the removed short region comprising a portion of the seed layer not covered by the conductive layer or comprising a portion of the seed layer wherein the conductive layer is thinner than the remaining portion of the conductive layer.

16. The RF antenna of claim 15 wherein the conductive layer does not cover the bond pads.

17. A system including the RF antenna of claim 15 further including an integrated circuit connected to the bond pads.

18. The RF antenna frequency antenna of claim 15 wherein the seed layer comprises a cured conductive ink layer.

19. An RF antenna comprising:
a substrate layer;
a seed layer on top of the substrate layer in an antenna pattern, the seed layer including bond pads;
a conductive layer contacting the seed layer over portions of the antenna pattern, wherein the conductive layer does not cover at least a portion of the bond pads;
wherein the antenna has a removed short region across the antenna pattern and; wherein the removed short region comprising a portion of the seed layer not covered by the conductive layer or comprising a portion of the seed layer wherein the conductive layer is thinner than the remaining portion of the conductive layer.

20. The RF antenna of claim 19 wherein the conductive layer does not cover the bond pads.

21. A system including the RF antenna of claim 19 further including an integrated circuit connected to the bond pads.

22. The RF antenna frequency antenna of claim 19 wherein the seed layer comprises a cured conductive ink layer.

23. The RF antenna frequency antenna of claim 19 wherein the antenna pattern is an antenna coil pattern.

* * * * *